(12) United States Patent
Barbour et al.

(10) Patent No.: US 7,139,944 B2
(45) Date of Patent: Nov. 21, 2006

(54) METHOD AND SYSTEM FOR DETERMINING MINIMUM POST PRODUCTION TEST TIME REQUIRED ON AN INTEGRATED CIRCUIT DEVICE TO ACHIEVE OPTIMUM RELIABILITY

(75) Inventors: Tange Nan Barbour, Hinesburg, VT (US); Thomas S. Barnett, Burlington, VT (US); Matthew Sean Grady, Burlington, VT (US); William Vincent Huott, Holmes, NY (US); Michael Richard Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 272 days.

(21) Appl. No.: 10/604,887

(22) Filed: Aug. 25, 2003

(65) Prior Publication Data

US 2005/0049810 A1 Mar. 3, 2005

(51) Int. Cl.
*G11C 29/00* (2006.01)
*G06F 11/00* (2006.01)
(52) U.S. Cl. ...................................... 714/718; 714/704
(58) Field of Classification Search ...................... None
See application file for complete search history.

(56) References Cited

U.S. PATENT DOCUMENTS 5,337,318 A * 8/1994 Tsukakoshi et al. ........ 714/708
6,141,779 A * 10/2000 Hill et al. .................... 714/710
6,373,758 B1 * 4/2002 Hughes et al. .............. 365/200
6,817,118 B1 * 11/2004 Schmeichel .................. 37/232
2003/0120445 A1 6/2003 Barbour et al.

OTHER PUBLICATIONS

Thomas S. Barnett, Adit D. Singh and Victor P. Nelson; "Estimating Burn-In Fall-Out for Redundant Memory", Department of Electrical and Computer Engineering, Auburn University, Auburn, AL 36849, 8 pages.

* cited by examiner

*Primary Examiner*—Christine T. Tu
(74) *Attorney, Agent, or Firm*—Robert A. Walsh; Dillon & Yudell LLP

(57) ABSTRACT

A method and system for determining minimum post production test time on an integrated circuit device to achieve optimal reliability of that device utilizing defect counts. The number of defective cells or active elements with defective cells (DEFECTS) on the integrated circuit device are counted and this count serves as a basis for determining the minimum test time. A higher number of DEFECTS results in longer post production testing in order to achieve optimum reliability of the integrated circuit device. The number of DEFECTS can be counted on a device internal to the integrated circuit device and made available to determine the minimum required test time. The number of DEFECTS can also be obtained external to the integrated circuit device by intercepting information routed to another device. Information provided internally and externally can also reveal the physical location of DEFECTS to further refine the minimum required test time.

21 Claims, 7 Drawing Sheets

METHOD AND SYSTEM FOR DETERMINING MINIMUM POST PRODUCTION TEST TIME REQUIRED ON AN INTEGRATED CIRCUIT DEVICE TO ACHIEVE OPTIMUM RELIABILITY

BACKGROUND OF INVENTION

1. Technical Field

The present invention relates generally to integrated circuit device testing and in particular to post production integrated circuit device testing. Still more particularly, the present invention relates to determining the minimum amount of post production testing required on an integrated circuit device to achieve optimum reliability of that device.

2. Description of the Related Art

A large fraction of the integrated circuits manufactured today contain some form of defect tolerance or redundancy. Incorporating redundancy into an integrated circuit allows manufacturers to repair many of the defects that would otherwise lead to circuit failures by replacing the defective circuit with a redundant circuit. This can therefore significantly increase the product yield. In memory circuits with redundant memory, for example, it is not uncommon for yields to increase 10 fold when compared to the same circuits containing no redundancy.

The number of defects that are repaired is of significant interest in areas such as yield modeling, yield learning, reliability estimation and test time reduction. For instance, it is known that as the number of defective elements on an integrated circuit device increases the more likely the integrated circuit device is to fail. Accordingly, the amount of post production test time required to insure an integrated circuit device is reliable increases with the number of defective elements present on the integrated circuit device. Despite this, manufacturers do not currently record this information directly or even attempt to obtain it from repair data.

Use of a defect count correlates well with a yield/reliability model in which the number of defects a given repaired chip possesses predicts the chip's probability of failing a reliability test. (See T. S. Barnett, A. D. Singh, M. Grady, K. G. Purdy, "Redundancy Implications for Product Reliability: Experimental Verification of an Integrated Yield Reliability Model", Proceedings 2002 International Test Conference, October 2002, to appear).

A paper presented at the IEEE International Test Conference in 2001, titled "Estimating Burn In Fallout for Redundant Memory", authored by T. S. Barnett, et al, describes how the number of repaired defects can be used to estimate the early life reliability of redundant memories. The paper "Yield Reliability Modeling for Fault Tolerant Integrated Circuits" by T. S. Barnett et al., (Proceedings of Defect and Fault Tolerance, October, 2001), extends this approach to more general fault tolerant architectures. While these works demonstrate how one could exploit defect count information for the purpose of early life reliability prediction, no specific technique for obtaining defect counts from integrated circuits is discussed. It would be desirable, therefore, to provide a mechanism for automatically counting defective cells and active elements with defective cells in order to the minimize the amount of post production testing required on an integrated circuit device to achieve optimum reliability of that device.

SUMMARY OF INVENTION

It is therefore one object of the present invention to provide improved integrated circuit testing.

It is another object of the present invention to provide improved post production testing for integrated circuit devices.

It is another object of the present invention to minimize the amount of post production testing required on an integrated circuit device to achieve optimum reliability of that device.

The foregoing objects are achieved as is now described. A counter is added to built in self test circuits on integrated circuit devices and is incremented each time a defective cell or an active element with a defective cell is detected on an integrated circuit device. The output of the counter is made available to a system that analyzes the number of defective cells or active elements with defective cells relative to normalized numbers for that integrated circuit device lot and determines the minimum amount of post production test time required on an integrated circuit device to achieve optimum reliability of that device.

Alternatively, the information about defective cells or active elements with defective cells (DFECTS) that is made available to an external device, such as a laser fuse tool, is provided to a system that analyzes the number of DEFECTS relative to normalized numbers for that integrated circuit device lot. The system then determines the minimum amount of post production test time required to achieve optimum reliability for said integrated circuit device.

The above as well as additional objectives, features, and advantages of the present invention will become apparent in the following detailed description.

BRIEF DESCRIPTION OF DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

Figure 1:
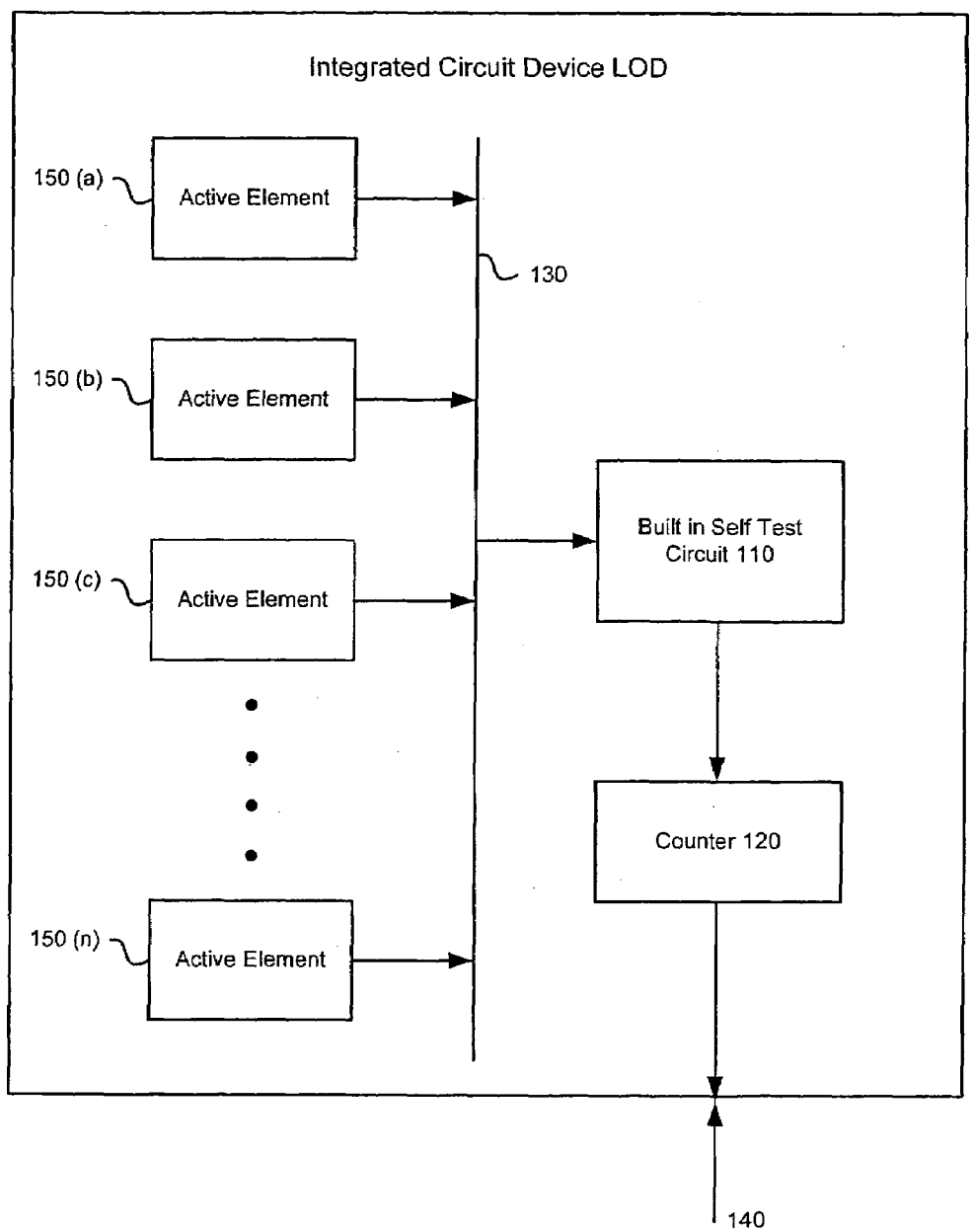
FIG. 1 is a schematic representation of an integrated circuit device comprising one or more active elements, a built in self test circuit, and a counter circuit.

With reference now to the figures, and in particular with reference to FIG. 1, there is depicted an integrated circuit device 100 as one embodiment of the present invention. Integrated circuit device 100 includes a built in self test (BIST) circuit 110 that is directly coupled to counter 120 so that it can be incremented each time BIST circuit detects a DEFECTS. Each active elements 150(a) 150(n) may contain one or more cells, any of which may be defective. The counter is coupled to output port 140 so that the count is accessible to determine a minimum post production test time required on an integrated circuit device to achieve optimal reliability of that device. BIST circuit 110 is also coupled to BIST interface 130. Active elements 1 through n 150(a) 150(n) are coupled to the BIST interface 130 to make it possible for BIST circuit 110 to access each active element 150(a) 150(n). Those with ordinary skill in the art would recognize that active elements could be memory modules, processor modules, controller modules, or any other electronic module.

Figure 2:
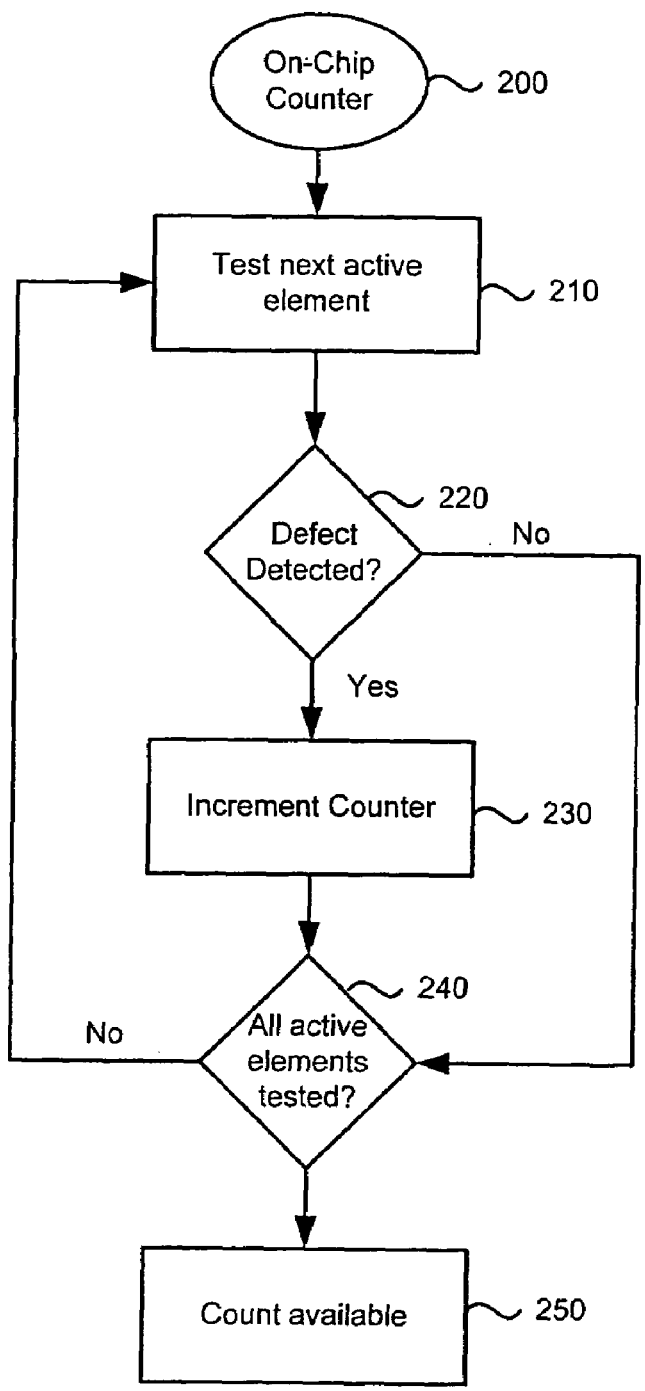
FIG. 2 is a high level logic flow chart of the on-chop counter process used to determine the minimum amount of post production testing required on an integrated circuit device to achieve optimum reliability of that device with a counter circuit.

Referring now to FIG. 2 that depicts a high level logic flowchart of an on-chip counter process 200. The first step in the process is to test the next active element for defective cells 210. If one or more DEFECTS are detected 220 in the active element, then a counter is incremented 230. If a defect is not detected, this step is bypassed and the next step is to determine if all active elements are now tested. 240. If they are, the count of DEFECTS is available 250 to determine minimum post production test time required on an integrated circuit device to achieve optimum reliability of that device. If they are not, the next step is to return to test the next active element 210 and repeat the foregoing process until all active elements have been tested.

Another embodiment of the present invention may incorporate banks of metal fuses on the integrated circuit device. A laser tool is then used to delete some of the fuses on the integrated circuit device. These fuses are connected to a circuit on the integrated circuit device that discerns the presence or absence of the fuse. Presence of a fuse indicates to the integrated circuit device that the redundant element should be used. Absence of a fuse similarly, indicates to the integrated circuit device that the redundant element should not be used. The presence and absence of fuses is also translated into a code that indicates to the integrated circuit device which element of the integrated circuit is to be replaced by the redundant element. One of ordinary skill in the art will recognize that this is just one method of creating redundancies on integrated circuit devices. Other methods of redundancy will provide similar defect count information that may be used to determine minimum test times.

Figure 3:
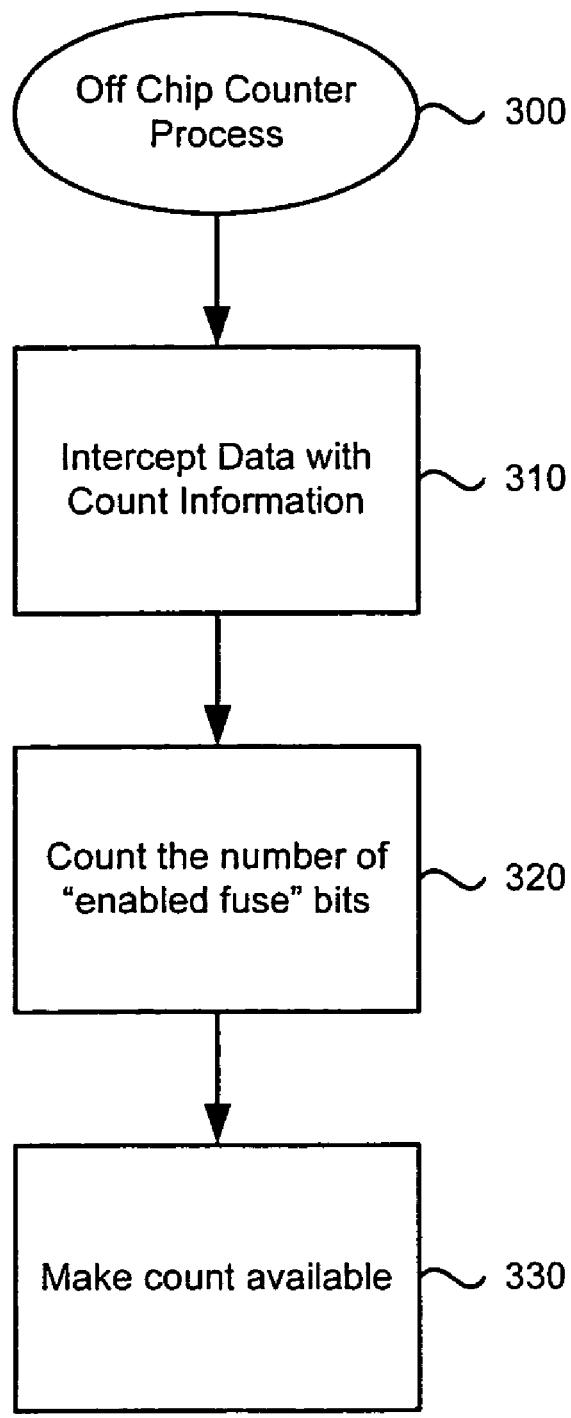
FIG. 3 is a high level logic flow chart of the off-chip count process used to determine the minimum amount of post production testing required on an integrated circuit device to achieve optimum reliability of that device.

FIG. 3 depicts a high level logic flowchart of such an off-chip counter process 300. The first step is to intercept instructions routed to a laser fuse tool 310 used to delete fuses on the integrated circuit device. Then the number of "enable fuse" bits that remain are counted 320. Since each one of these corresponds one to one with a redundant element replacement, this count represents the number of DEFECTS on the integrated circuit device. This count is made available to determine the minimum amount of post production test time required on an integrated circuit device for optimal reliability of that device.

The intercepted instructions in this embodiment may also be used to identify more information that just the number of DEFECTS. A fuse design may be employed that may determine the location of the DEFECTS. Post production test time may then be more accurately determined by analyzing the physical proximity of DEFECTS. For instance, instead of a single fuse for each redundant element, there could be nine fuses. The first would be an enable bit and the remaining eight fuses representing the logical address of the active element with defective cells that is being replaced. Since the laser tool would receive instructions regarding the enable bit fuse and the eight address fuses, the addresses can be intercepted as well as the count. As a result, the physical location of DEFECTS is known based on the logical address. If the DEFECTS are close together in physical proximity, then more post production testing might be required on an integrated circuit device to achieve optimum reliability of that device. The proximity of DEFECTS along with the count of DEFECTS will be used together to determine a minimum post production test time.

Figure 4:
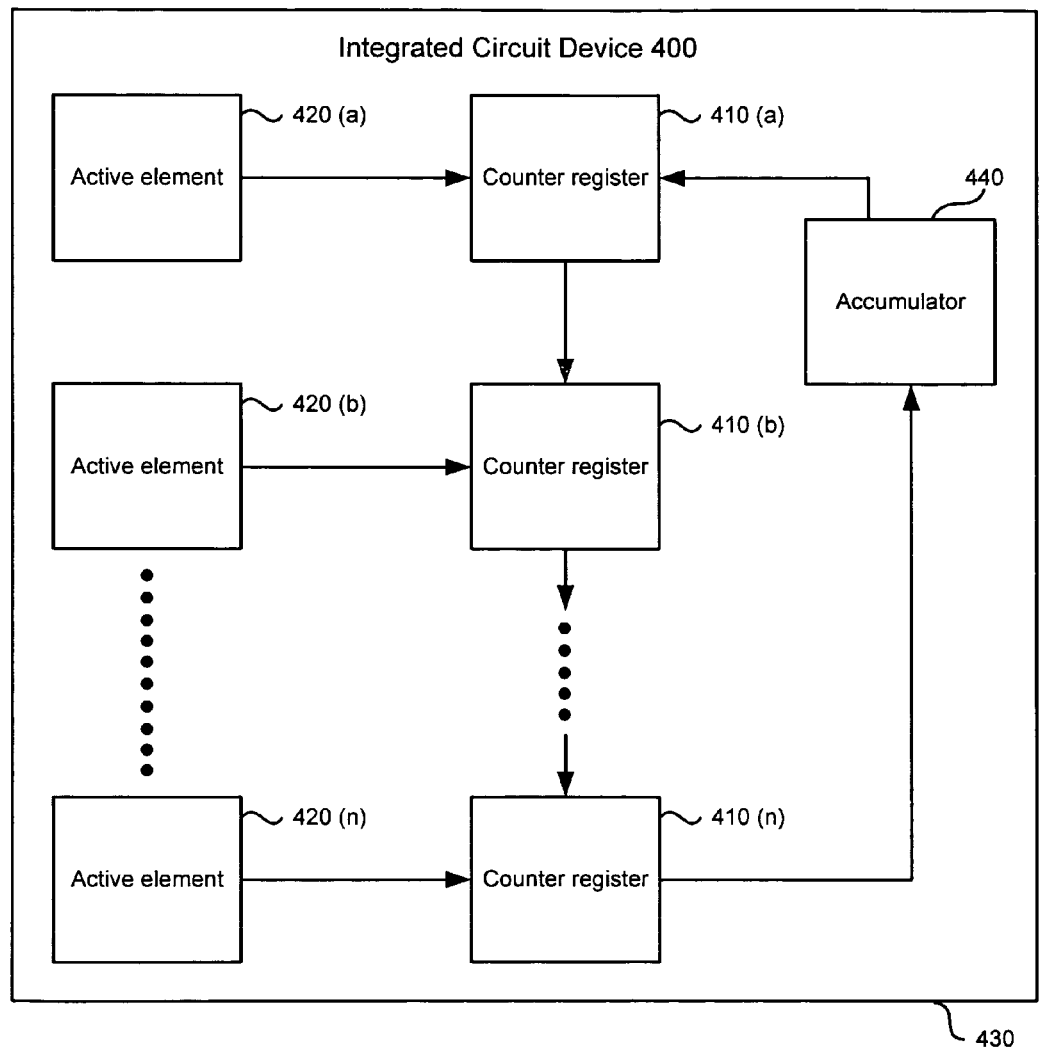
FIG. 4 is a schematic representation of an integrated circuit device comprising one or more active elements, each containing its own built in self test circuit with a counter which is daisy chained to the counter of the adjacent active element.

Now referring to FIG. 4, there is depicted an integrated circuit device 200 in another embodiment of the present invention. Integrated circuit device 400 includes active elements 420(a) 420(n). Each active element 420(a) 420(n) contains a BIST and is coupled to its own individual count register 410(a) 410(n). Each count register 410(a) 410(n) is coupled to the next count register 410(a) 410(n). The final count register 410(n) is coupled to an accumulator 440, which is coupled to count register 410(a). This configuration allows the count in each count register 410(a) 410(n) to be shifted to and accumulated in accumulator 440 such that the total count from all count registers 410(a) 410(n) is available at output port 430. This configuration also allows the original count in each count register to be preserved because it is shifted back into the count register during the accumulation process. Thus, if a particular active element count needs to be utilized to determine the minimum post production test time required on an integrated circuit device to achieve optimum reliability of that device, it is available at output port 430. Those with ordinary skill in the art would recognize that active elements contain one or more cells and could be memory modules, processor modules, controller modules, or any other electronic module.

Figure 5:
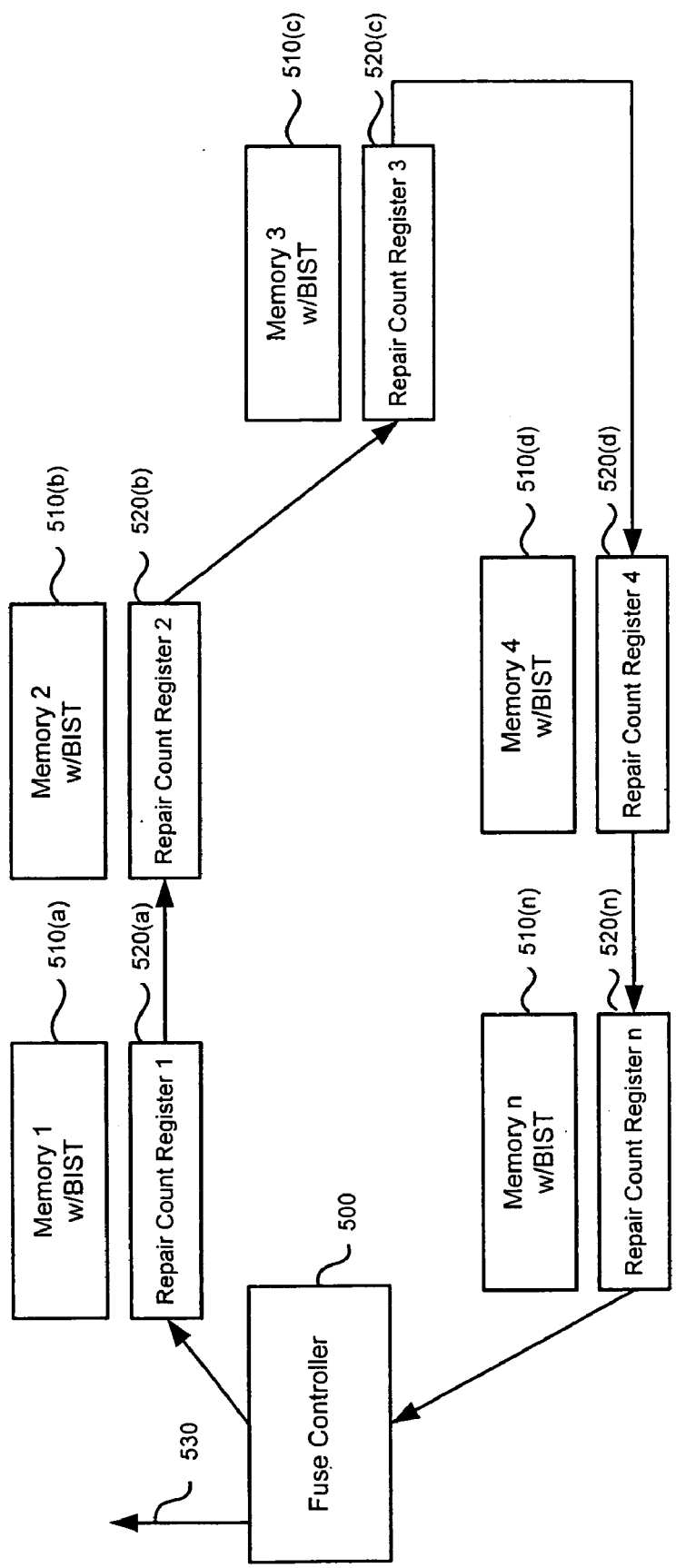
FIG. 5 is a high level block diagram of the integrated circuit of FIG. 4.

FIG. 5 depicts a high level block diagram of the integrated circuit device shown in FIG. 4. A repair count register 520(a) 520(n) is added to the BIST engine of each memory 510(a) 510(c) on the integrated circuit to store the number of repairs. Each repair count register 520(a) 520(n) is daisy chained to the next repair count register 520(a) 520(n) on the chip, and connected to the main fuse controller 500. The main fuse controller 500 alternately shifts and accumulates the repair count from each of the repair count registers 520(a) 520(n) until the total repair count is accumulated. As the data is shifted into the main fuse controller 500, the main fuse controller 500 shifts the data back into the repair count registers 520(a) 520(n) so that they are each returned to their original state. This allows for the counts to be output at the end of the entire sequence, such that individual memory fail counts are available via an output pin 530.

Figure 6:
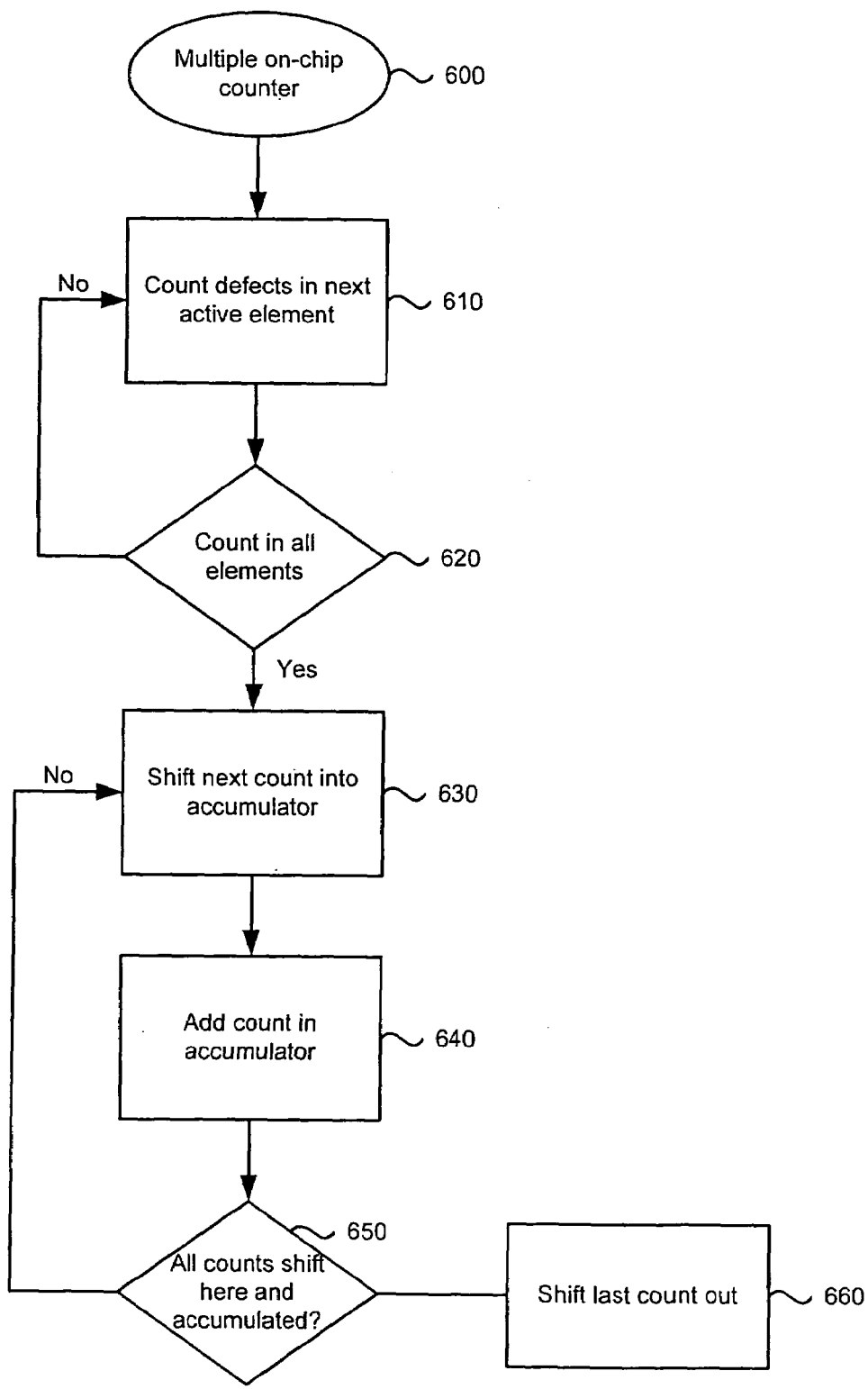
FIG. 6 is a high level logic flow chart of the multiple on-chip counter process.

Referring now to FIG. 6, a high level logic diagram of the multiple on-chip counter process 600. In the first step, DEFECTS are counted in the next active element 610 and the number is deposited in the count register. The next step checks to see if the DEFECTS have been counted in all of the active elements 620. If they have not, the process returns to count the DEFECTS in the next active element 610. If they have, then the next count is shifted into the accumulator 630 from the count register. The count is added to the accumulated value in the next step 640. The next step is to determine if all counts from all active elements have been shifted into the accumulator 650. If they have not, the process returns to shift in the next count 630. If they have then the final step is to shift the last count in the accumulator out 660, so that all count registers contain their original number.

Figure 7:
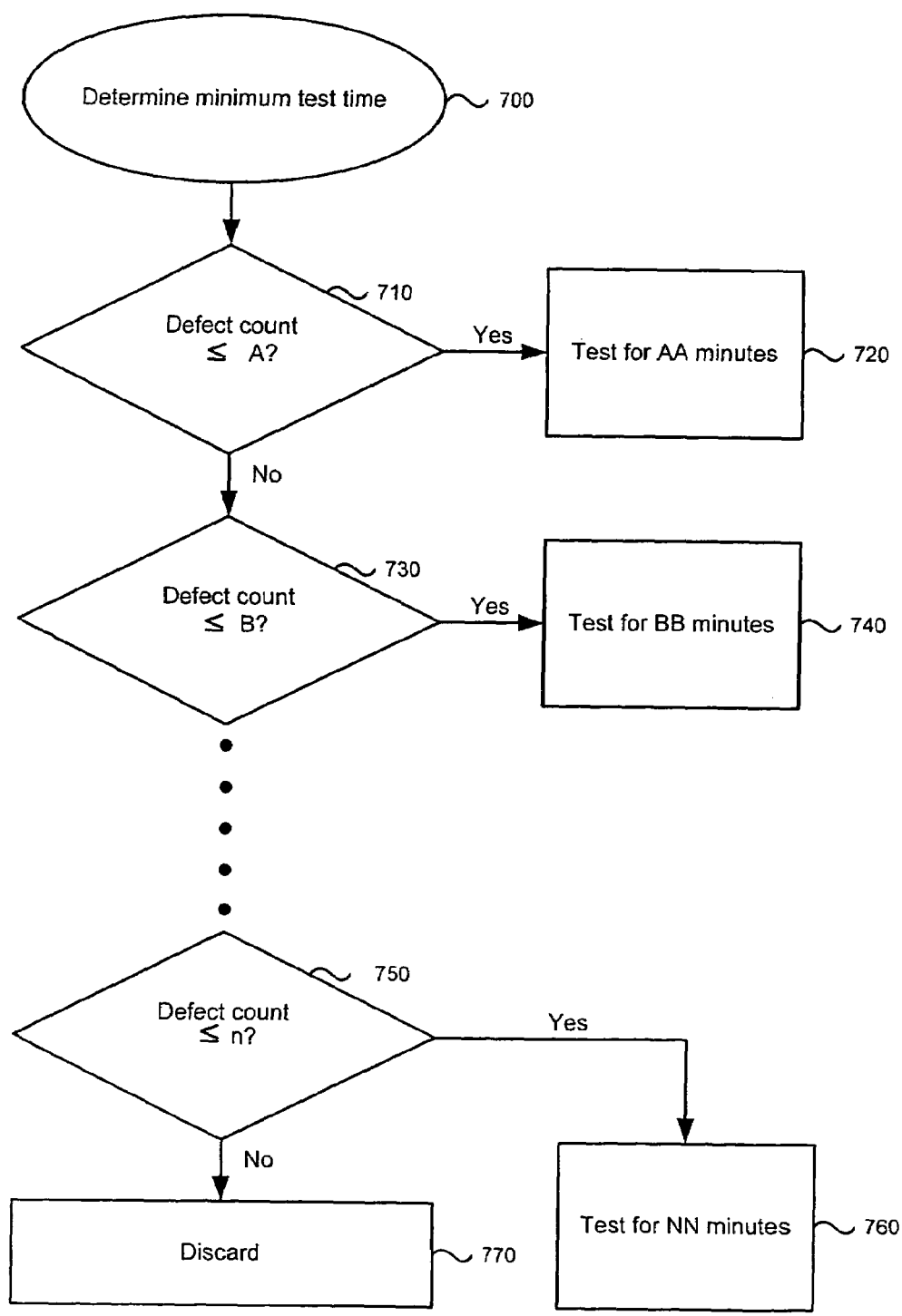
FIG. 7 is a high level logic flow chart for the determine minimum test time process used in determining the minimum amount of post production testing required on an integrated circuit device to achieve optimum reliability that device.

Referring now to FIG. 7, that is a high level logic flowchart of the determine minimum test time process 700. In the first step, DEFECTS count is compared to a predetermined count A 710. This predetermined count could be determined as a result of analysis of wafer or die lots. The predetermined count could also be updated in real time to reflect a trend in DEFECTS counts. If it is less than or equal to A, then the minimum test time is a predetermined amount AA 720. The predetermined test time may also be updated in real time to reflect a trend in active element with defective cell counts. It could also be determined as a result of analysis of wafer or die lots. If it is not less than or equal to A, then DEFECTS count is compared to B to determine if it is less than or equal to B 730. If it is, then the minimum test time is BB. This comparison test is completed for up to N times, where N is the number of different levels of predetermined minimum test times based on defect counts 750. If there are too many defects, the integrated circuit device may be discarded 770. One of ordinary skill in the art would recognize that there is a plurality of methods that could be employed to determine the incremental defect counts and the subsequent minimum amount of post production test time required to achieve optimal reliability of that device.

While the invention has been particularly shown and described with reference to a preferred embodiment, it will be understood by those skilled in the art that various changes in form and detail may be made therein without departing from the spirit and scope of the invention.

What is claimed is:

1. A method for determining a minimum amount of post production testing required on an integrated circuit device to achieve optimum reliability of said integrated circuit device, said method comprising:
    detecting defective cells or active elements containing defective cells within said integrated circuit device;
    counting a number of said defective cells or active elements containing defective cells; and
    determining a minimum amount of post production testing required on said integrated circuit device to achieve a pre-determined measure of reliability of said integrated circuit device, said determining based upon said number of defective cells or active elements containing defective cells compared against one or more preset, normalized numbers.

2. The method of claim 1 wherein post production testing is stress testing.

3. The method of claim 1 wherein active elements are memory modules.

4. The method of claim 1 wherein said integrated circuit device comprises one or more activatable redundant elements, said method further comprising activating redundant elements to replace said defective cells or active elements containing defective cells.

5. The method of claim 1, wherein said determining comprises:
    comparing said number against a first of the one or more preset normalized numbers; and
    when said number is less than the first preset normalized number, assigning a minimum amount of post production testing associated with the first preset normalized number.

6. The method of claim 5, wherein when there are multiple preset normalized numbers, each corresponding to an associated minimum amount of post production testing, said method further comprises:
    determining a lowest preset normalized number below which said number falls; and
    assigning the minimum amount of post production testing associated with the lowest preset normalized number below which said number falls.

7. An apparatus for determining a minimum amount of post production testing required on an integrated circuit device to achieve optimum reliability of said integrated circuit device, said apparatus comprising:
    one or more self test circuits within said integrated circuit device for detecting defective cells or active elements containing defective cells;
    a counter coupled to each said self test circuit for incrementing a count for each said defective cell or active element containing defective cells; and
    a control means coupled to said counter for determining a minimum amount of post production testing required on said integrated circuit device to achieve a pre-determined measure of reliability of said integrated circuit device, said determining based upon said count of defective cells or active elements containing defective cells compared against one or more preset, normalized numbers.

8. The apparatus of claim 7 wherein post production testing is stress testing.

9. The apparatus of claim 7 wherein active elements are memory modules.

10. The apparatus of claim 7 further comprising one or more activatable redundant elements for replacing said active elements containing defective cells.

11. The apparatus of claim 7, wherein said control means for determining comprises:
    means for comparing said number against a first of the one or more preset normalized numbers; and
    when said number is less than the first preset normalized number, means for assigning a minimum amount of post production testing associated with the first preset normalized number.

12. The apparatus of claim 11, wherein when there are multiple preset normalized numbers, each corresponding to an associated minimum amount of post production testing, said apparatus further comprises:
    means for determining a lowest preset normalized number below which said number falls; and
    means for assigning the minimum amount of post production testing associated with the lowest preset normalized number below which said number falls.

13. The apparatus of claim 7 further comprising:
    each said counter coupled to a sequential said counter to shift counts from one counter to another;
    an accumulator coupled to the last said counter and to the first said counter to accumulate a total count for all counters;
    a control means coupled to said accumulator for determining a minimum amount of post production testing required on said integrated circuit device to achieve a pre-determined measure of reliability of said integrated circuit device, said determining based upon said accumulated count.

14. The apparatus of claim 7, wherein said control means is a fist control means, said apparatus further comprising a second control means for:
  determining a physical location of each defect;
  analyzing a proximity of a first defect relative to a second defect; and
  evaluating a second amount of post production testing in an inverse portion to the relative proximity of the first defect to the second defect.

15. The apparatus of claim 14, wherein:
  said second control means further comprises means for determining the physical locations based on a logical address of each defect; and
  said apparatus further comprises means for determining a final amount of post production testing based on both the second amount evaluated by the second control means and the amount determined by the first control means.

16. A computer program product residing in a storage media for determining a minimum amount of post production testing required on an integrated circuit device to achieve optimum reliability of said integrated circuit device, said computer program product comprising instructions for:
  intercepting a signal containing information about defective cells (defects) in said integrated circuit device;
  analyzing said information to determine a number of said defects; and
  determining a minimum amount of post production testing required on said integrated circuit device to achieve a predetermined measure of reliability of said integrated circuit device, said determining based upon said number compared against one or more preset, normalized numbers.

17. The computer program product of claim 16 wherein post production testing is stress testing.

18. The computer program product of claim 16 wherein active elements are memory modules.

19. The computer program product of claim 16 further comprising the instructions of:
  analyzing said information to determine the location of defects;
  more accurately determining a minimum amount of post production testing required on said integrated circuit device to achieve a predetermined measure of reliability of said integrated circuit device using said location.

20. The computer program product of claim 16, wherein said instructions for determining comprises instructions for:
  comparing said number against a first of the one or more preset normalized numbers; and
  when said number is less than the first preset normalized number, assigning a minimum amount of post production testing associated with the first preset normalized number.

21. The computer program product of claim 16, wherein when there are multiple preset normalized numbers, each corresponding to an associated minimum amount of post production testing, said instructions further comprises instructions for:
  determining a lowest preset normalized number below which said number falls; and
  assigning the minimum amount of post production testing associated with the lowest preset normalized number below which said number falls.

* * * * *